United States Patent
Rao et al.

(10) Patent No.: US 7,433,258 B2
(45) Date of Patent: Oct. 7, 2008

(54) POSTED PRECHARGE AND MULTIPLE OPEN-PAGE RAM ARCHITECTURE

(75) Inventors: G. R. Mohan Rao, McKinney, TX (US); Franz Michael Schuette, Colorado Springs, CO (US)

(73) Assignee: DataSecure LLC., LeClaire, IA (US)

( * ) Notice: Subject to any disclaimer, the term of this patent is extended or adjusted under 35 U.S.C. 154(b) by 335 days.

(21) Appl. No.: 10/711,841

(22) Filed: Oct. 8, 2004

(65) Prior Publication Data
US 2005/0078506 A1  Apr. 14, 2005

Related U.S. Application Data

(60) Provisional application No. 60/525,453, filed on Nov. 28, 2003, provisional application No. 60/510,182, filed on Oct. 10, 2003.

(51) Int. Cl.
*G11C 8/00* (2006.01)
(52) U.S. Cl. .............................. 365/230.03; 365/189.05; 365/230.09; 365/233.1
(58) Field of Classification Search ............ 365/230.09, 365/189.05, 230.03, 233.1
See application file for complete search history.

(56) References Cited

U.S. PATENT DOCUMENTS

| | | | | |
|---|---|---|---|---|
| 5,835,965 A | * | 11/1998 | Taylor et al. ................. | 711/211 |
| 6,023,745 A | * | 2/2000 | Lu ................................ | 711/5 |
| 6,151,236 A | * | 11/2000 | Bondurant et al. ............ | 365/49 |
| 6,438,670 B1 | * | 8/2002 | McClannahan ............. | 365/194 |
| 6,442,644 B1 | * | 8/2002 | Gustavson et al. .......... | 365/194 |
| 2002/0013881 A1 | * | 1/2002 | Delp et al. ................... | 711/105 |
| 2002/0075746 A1 | * | 6/2002 | Ooishi .................... | 365/230.03 |
| 2003/0126356 A1 | * | 7/2003 | Gustavson et al. .......... | 711/105 |
| 2004/0039870 A1 | * | 2/2004 | Roohparvar ................. | 711/103 |
| 2004/0165472 A1 | * | 8/2004 | Yamazaki ................... | 365/233 |

* cited by examiner

*Primary Examiner*—Thong Q Le
(74) *Attorney, Agent, or Firm*—Hartman & Hartman, P.C.; Gary M. Hartman; Domenic N.S. Hartman

(57) ABSTRACT

A method and architecture that overcomes the problem of latency-caused performance degradation of electronic memory systems. The method involves a "Posted Precharge," by which an external command for Precharge is given as early as possible, such as immediately following a Read command. The execution of the Precharge is delayed by a precharge counter until all Read/Write commands are completed. By posting a precharge command on a bus at the first available opportunity, multiple pages can be open on the same bank of a memory device. As a result, access latencies are significantly reduced and efficiency of bus in electronic memory systems is significantly improved.

26 Claims, 12 Drawing Sheets

POSTED PRECHARGE AND MULTIPLE OPEN-PAGE RAM ARCHITECTURE

CROSS REFERENCE TO RELATED APPLICATIONS

This application claims the benefit of U.S. Provisional Application Nos. 60/510,182 filed Oct. 10, 2003, and 60/525,453, filed Nov. 28, 2003.

BACKGROUND OF THE INVENTION

The present invention generally relates to electronic systems utilizing memory devices. More particularly, this invention relates to a method and memory architecture that enables multiple pages to be open on the same bank of a memory device.

High density random access memories (RAM) find numerous applications in computers, communications, and consumer and industrial applications. These memories are mostly volatile (lose stored data when power is switched off). These cost sensitive, medium performance (high bandwidth with moderate latency) segments have been served by multibank SDRAM's (synchronous dynamic random access memories). SDR SDRAM's, DDR-I SDRAM's, DDR-II SDRAM's, QDR SDRAM's, Rambus™ DRAM's, Network DRAM's™, FCRAM's™, and RLDRAM's™ are among the numerous varieties of DRAM available in the commercial market. In addition to DRAM, other types of memory finding use in a variety of applications include high-density flash memory products, which provide nonvolatile storage at reasonably high-densities. High-density flash memories are used in portable electronic appliances such as cell phones, digital cameras, etc.

Emerging applications in computer and communications processors (CPU's, NPU's) will increasingly require (in addition to bandwidth and fairly low latency at low cost) the ability to open new rows in the currently active banks in these SDRAM's (single-chip IC's, DIMM modules, RIMM modules, or other memory subsystems comprising multiple SDRAM's) for superior performance. Specifically, the advent of hyperthreading, multithreading, multichannel-DRAM access, shared memory and other processor inventions is making essential a different SDRAM architecture with a multiple open-page capability. However, current DRAM architectures and timings require "closing current active row/page in a bank," before a new row/page can be "opened" in the same bank.

Current leading-edge general-purpose SDRAM's are multibank devices designated as "DDR-I" or just "DDR" (double data rate) for the current generation of devices and "DDR-II" or "DDR2" for the emerging new generation. Four internal banks are the current standard; eight-bank DDR-II devices are now being introduced. Herein, "DDR" refers generically to both DDR-I and DDR-II, unless otherwise indicated. References to SDRAM's are to all SDRAM's including but not limited to DDRs, unless otherwise indicated.

As is true of SDRAM's in general, and assuming proper memory controller support, any one or more of the internal banks can be activated by an Active command at one (but only one) row address at a given time. The row addresses can be the same or different for any or all of the banks. This basic "one open row per bank at a time" limitation arises from the inherent properties of the one-transistor, one-capacitor (1T/1C) storage cells that comprise the basic storage unit of the SDRAM core, combined with the peripheral architecture of the multibank SDRAM. If a memory subsystem has memory devices mounted in separate "ranks" (on a module) or in two (or possibly more) modules inserted into separate slots on the motherboard, the capacity of the memory is correspondingly increased and the number of open pages can be increased to a maximum of the number of ranks times the number of internal banks per device. Under that peripheral architecture, all banks have to share the same, single data path to the external world. Even with separate data I/O circuitry for each bank, it is still only one bank at a time that can accept Read or Write commands from the memory controller. The 1T/1C memory cell, which is the essence of SDRAM architecture in general for cost and density reasons, imposes the further "one open row per bank" limitation. These limitations apply to SDR SDRAM's as well as DDR SDRAM's, and other DRAM's using 1T/1C memory cell as the basic storage element. In addition to "restore after read," a sense/read/write amplifier dedicated to precharge of bit line(s) as well as sense/restore functions aggravates the latency limitation.

In order to activate a bank for reading from or writing to one of its rows, the bank must first be charged in order to allow the chip to sense the particular row and amplify the signal from that row. Rather than waiting for a Read/Write request before being charged, a memory bank is usually precharged, initiated by a "Precharge" command. Opening a row in an SDR or DDR SDRAM activates a "page," which is a 2-dimensional array of bits defined by the length of the row in one dimension, and the "width" of the device (being equal to the number of I/O pins in the device) in the second dimension. The length of the row is determined by the number of columns that intersect the row. In total number of bits, the size of the page is, therefore, equal to the number of column addresses multiplied by the number of I/O pins. Whenever data is read from or written to a device, the specific column number within a row address is furnished and a string of bits equal to the number of I/O pins can be retrieved from or stored in the device. The number of column addresses equals 2 to the power of the number of column address lines. This I/O is combined with I/O from or to the other devices on the memory module(s) comprising the SDRAM memory subsystem, so as to deliver the total package of bits (generally 64 bits in the case of conventional SDRAM memory subsystems, though with important exceptions) onto the memory bus in the case of a Read or store it in the module(s) in the case of a Write.

Closing of any bank is initiated by a Precharge command, which means that the command bus will be busy during the Precharge command. In SDRAM's in general, precharging introduces a delay or latency before the new bank can be given an Activate command whereby the process of opening the new bank is started. This "Precharge Latency" is often referred to symbolically as tRP, and is typically in the range of 2 to 5 clock cycles. There are numerous timing parameters that define the actual performance of SDRAM's in general and DDR-II devices in particular. The interaction of these parameters varies considerably, sometimes greatly, depending on the exact circumstances of a given access to the memory subsystem. The interaction is extremely complex, and requires many timing diagrams for a rigorous explanation. Only certain timing parameters will be discussed herein, and their explanations will be necessarily simplified and instructive only in its coverage of some of the various combinations of the timing parameters. Even if the Precharge can be hidden behind an ongoing output burst, the command bus shared by all devices will be busy, and thus prevent the issuing of other commands. Conflicting needs for commands during the same cycle are usually referred to as "command bus contention" and are a significant component of tRP and other limitations.

Following satisfaction of this latency and upon issuance of the Activate command, there begins a second latency period, often described as the "Active to Read or Write command delay," or "RAS-to-CAS delay," or a similar term, and is generally symbolized by tRCD. This latency is generally in the range of 2 to 5 clocks, and must be satisfied before a Read or Write command can be issued. In order to avoid command bus contention, starting with DDR-II, the Read or Write command can be issued as early as the next clock cycle following the Activate command. However, since tRCD needs to be satisfied before the execution of the Read or Write command can commence, the command needs to be pushed out internally within the device according to a predefined "Additive Latency" (AL). This mode of operation is referred to as postponed or "posted" CAS mode.

Following this comes another latency period, generally known as "/CAS Latency" (CL), a programmed value generally 2 to 4 clocks in length, which begins with the commencement of internal execution of the Read or Write command, and extends until the data is placed on the memory bus for sending to the processor in the case of a Read or written into the SDRAM in the case of a Write. In the nomenclature of the current JEDEC DDR-II Standard, and commonly in industry specification sheets also, the sum of AL and CL equals the "Read Latency" or "Read Access of the first Critical Word." The equivalent latency parameter for Writes, "Write Latency," equals Read Latency minus 1.

In a DDR device, depending on speed grade and other factors, the access latencies typically total in the range of 4 to 7 or more clocks to which the Precharge latencies (2 to 4 clocks) need to be added. The total is generally referred to as the "Active-to-Active command interval—Auto—Precharge," the "bank cycle time," or a similar term, generally symbolized as tRC. In short, the bank cycle time refers to the number of clocks required between two consecutive accesses to different rows in the same Bank, irrespective of whether they are Reads or Writes.

To be 100% efficient, an SDRAM memory subsystem would need to deliver data to the memory bus (in the case of Reads) or to the SDRAM array (in the case of Writes) on every clock cycle so as to respond fully to the processor's need to load (Read) or store (Write) data. In the case of DDR, the requirement is to deliver 2 bits of data per clock cycle at each I/O pin in the memory subsystem. If it took 9 to 12 or more clocks to deliver this quantity of data, efficiency would be near or below an unacceptable 10%. To improve on this in the case of consecutive accesses to the same bank, the bank is left activated/open after the first access, without Precharge. The first access to the bank incurs the full latencies, but accesses to the same bank thereafter can be made contiguous or nearly so by using the "burst" technique. Under this technique, just the starting column address for a burst of 2, 4 or 8 column addresses is strobed (4 or 8 for the DDR-II). The tRP and tRCD latencies are not incurred again as long as the row/page remains open, and because of the extremely high speed of internal SDRAM operation, successive column accesses equal to the length of the burst are enabled. Since only a single column address is strobed, /CAS Latency also need not be incurred again. Using this technique, once all latencies have been satisfied one time and accesses thereafter are confined to sequential column segments in the same row/page, the device can keep pace with the processor's demands for Reads and Writes and processor clock cycles are not wasted. If the device is programmed for "interleaved" burst accesses, the columns within a burst sequence are actually accessed in a numerically non-consecutive, although predetermined, order. If the burst length is 4 or 8, as in the case of a DDR-II device, subsequent commands and their related latencies (including tRP when a Precharge command is involved) can be partially or (especially if the burst length is 8) entirely hidden behind the burst operation.

On the basis of the above, largely uninterrupted back-to-back transactions to or from the processor are possible, assuming the bursted data is fully usable by the processor. However, this assumption is not correct in many cases. Typically, a data word is 8 Bytes (64 bits) wide from a memory DIMM or RIMM. Having 8-bit bursts necessitates instruction execution on 64 Bytes of data in the SAME PAGE to take maximum advantage—a very unlikely event in most applications. Moreover, in the case of burst Writes, a Write Recovery Latency (tWR) typically of 3 clocks after the last burst Write access must be satisfied before there can be issued a subsequent Precharge command, which must precede the access of any other bank. This is a "non-hideable" 3-clock latency imposing a 6-bit interruption (in the case of DDR) per I/O pin of the data flow, a significant performance loss. Before the current leading edge DDR-II, the AC operating characteristics of the DDR SDRAM were somewhat simpler and entailed use of several fewer timing parameters, but the basic issues described above also arose in substantially the same way.

If the row/page to be newly opened is located in a different bank of the device, the time period between the Activate commands in the old and new banks is often called the "Active bank A to active bank B command period" or "Row-to-Row Delay" (tRRD), which is needed to satisfy the row decoder latency. tRRD specifies the latency of jumping from one open row to another open row of different banks within the memory subsystem space. tRRD is typically on the order of 2 clocks and can usually be hidden behind ongoing data bursts, and therefore is likely to constitute a problem in cases of random, single-word accesses (but not otherwise).

Current SDRAM's do offer a programmable Read or Write Auto-Precharge function which in some cases reduces the tRP latency by hiding part of it. However, this is at the cost of closing the currently open row, thereby negating the advantage of the open page architecture, namely the extremely fast Reads/Writes of sequences of data which are located contiguously (i.e., in the same open page) in the SDRAM. Therefore, while the Auto-Precharge function can hide tRP latency and permit faster random accesses, it also defeats the principal advantage of the open page organization.

In view of the above, the performance of RAM devices can be limited by the inability to hold multiple pages open on the same bank of the memory subsystem. A worst case scenario would be encountered if data from two pages are requested where, after closing the first page and moving to the second page, the first page is needed again for additional data. The possibility of incurring this access pattern also constitutes the main performance limitation of pseudo-SRAM (pseudo static random access memory, or PSRAM) since it disallows single random accesses without satisfying the minimum RAS pulse width. Flash memory devices, both NOR and NAND type, also use a "page" architecture, for accessing the memory device. Therefore, as with DRAM devices, flash memory devices also suffer from the inability to hold multiple pages open on a single bank.

BRIEF SUMMARY OF THE INVENTION

The present invention provides a method and architecture that overcomes the problem of latency-caused performance degradation discussed above. The invention involves the use of what is termed herein a "Posted Precharge," which as used herein means that an external command for Precharge is given as early as possible, preferably immediately following a Read command. However, the present invention causes the execution of the Precharge to be delayed by means of an internal mechanism, preferably a counter means, until all Read/Write commands are completed. According to a preferred aspect of the invention, the method and architecture also provide that any subsequent access to the same page causes the counter means to be reset, further delaying the execution of the Precharge operation. In other words, the invention provides an internal Precharge scheme that starts the Precharge for that particular bank, activity-dependent, at an appropriate time, thus freeing up the command bus.

In view of the above, the Posted Precharge of the present invention finds analogy in some respects to the posted Read/Write command architecture of DDR-II SDRAM's referred to above. Moreover, compared to the simpler current scheme of an Auto-Precharge following a Read or Write, the Posted Precharge of this invention has the flexibility to accommodate single random accesses as well as bursts. Notably, the DDR-II architecture does not allow row accesses of less than a burst length of 4.

The benefits of this invention can be promoted by implementing the Posted Precharge on the DDR device itself, which has the potential for virtually eliminating command bus contentions. The benefits of Posted Precharge can also be obtained in DIMM's and SIMM's (and similar memory modules and/or subsystems) by implementing some or all of the features of the invention described herein in the memory controller (which manages memory module access and proper operation).

As noted above, the DDR-II does not provide for a 4 bit burst intra-burst interruption, and the minimum unit of data that can be efficiently accessed is 4 bits times the number of I/O pins. Thus in the case of shorter accesses, such as are required for networking operations and other applications, only a fraction of the bursted data is required at the processor level, and the balance represents wasted clock cycles and unproductive latencies. Further, the emerging hyperthreading, multithreading, multichannel-DRAM access, shared memory and other processor inventions referred to above are making multiple open-page capability in every bank an essential capability for the future, without incurring the latencies that currently attend intra-bank, multi-row accesses. In addition, the posted precharge allows the re-accessing of a previous page without incurring worst case scenario latencies.

In addition to DDR SDRAM's, the Posted Precharge approach of the present invention is equally applicable to FCRAM™, RLDRAM™, RDRAM™, XDRAM™, Network DRAM™, and other RAM architectures utilizing precharge cycles. The multiple open-page architecture of this invention is also equally applicable to volatile RAM's and nonvolatile RAM's, including flash memory.

Other objects and advantages of this invention will be better appreciated from the following detailed description.

DETAILED DESCRIPTION OF THE INVENTION

The utilization of the present invention applies to volatile as well as nonvolatile memories. Implementation in stand alone memory devices, SOC (System On Chip), SIP (System In Package), SIC (System In Chip), DIMM's (Dual In Line Memory Modules), SIMM's (Single In Line Memory Modules) and other combinations are possible. Furthermore, "page" architecture is widely used in DRAM's and flash memories, the operations of the latter being described in detail in the available literature and therefore will not be discussed in any detail here. "Precharge" is widely used for dynamic devices like DRAM's, FeRAM's (ferroelectric RAM's), etc. "Page" architecture is also expected to influence future memory products like MAG RAM's, plastic RAM's, CNT RAM's (carbon nano tube), organic memories, phase-change memories, molecular memories and similar products. As such, the implementation of the present invention encompasses all such devices, as well as other memory devices that employ a page architecture.

Figure 1:
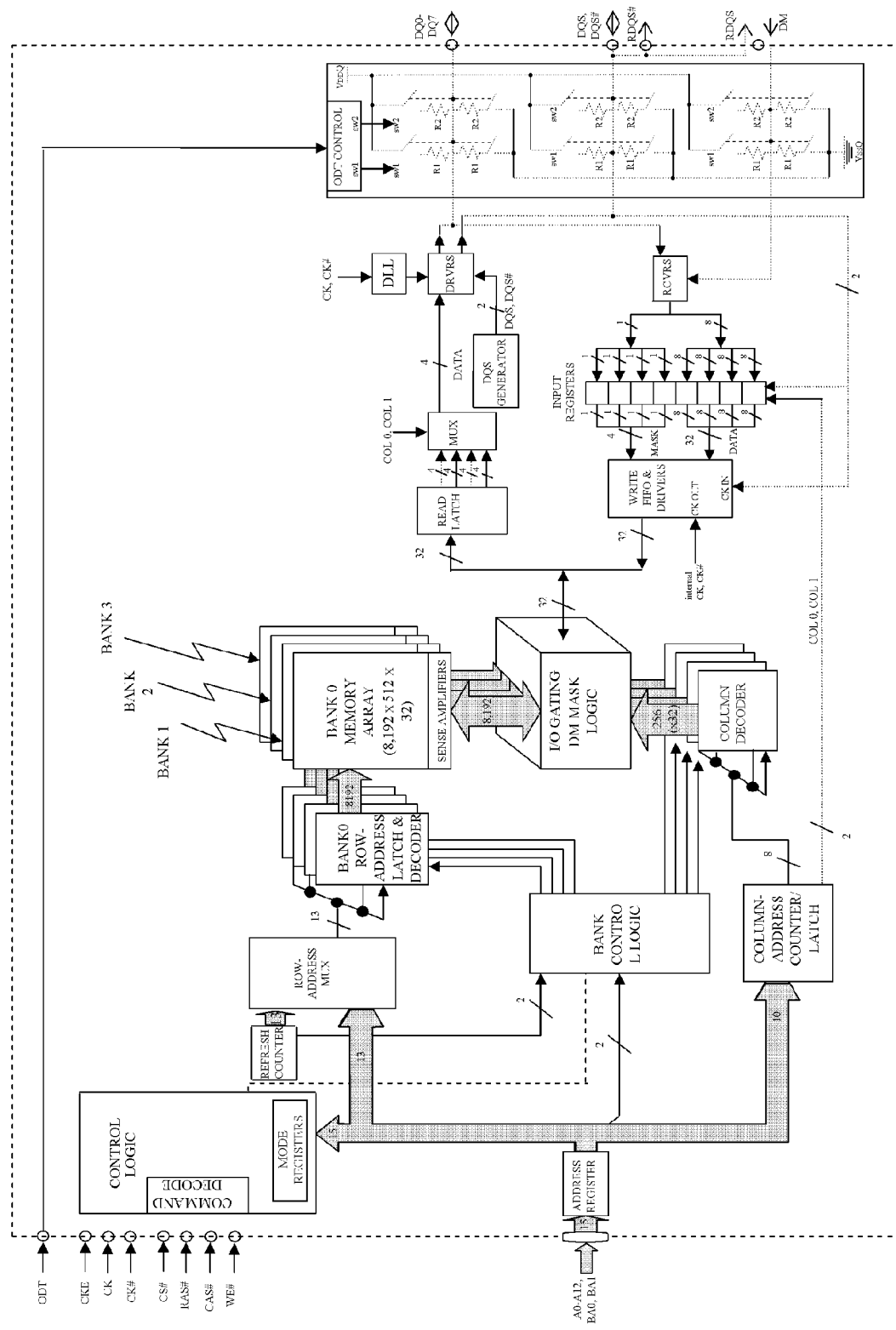
FIG. 1 illustrates a block diagram of a commercially-available 64 Meg×4, DDR2 SDRAM.
Figure 2:
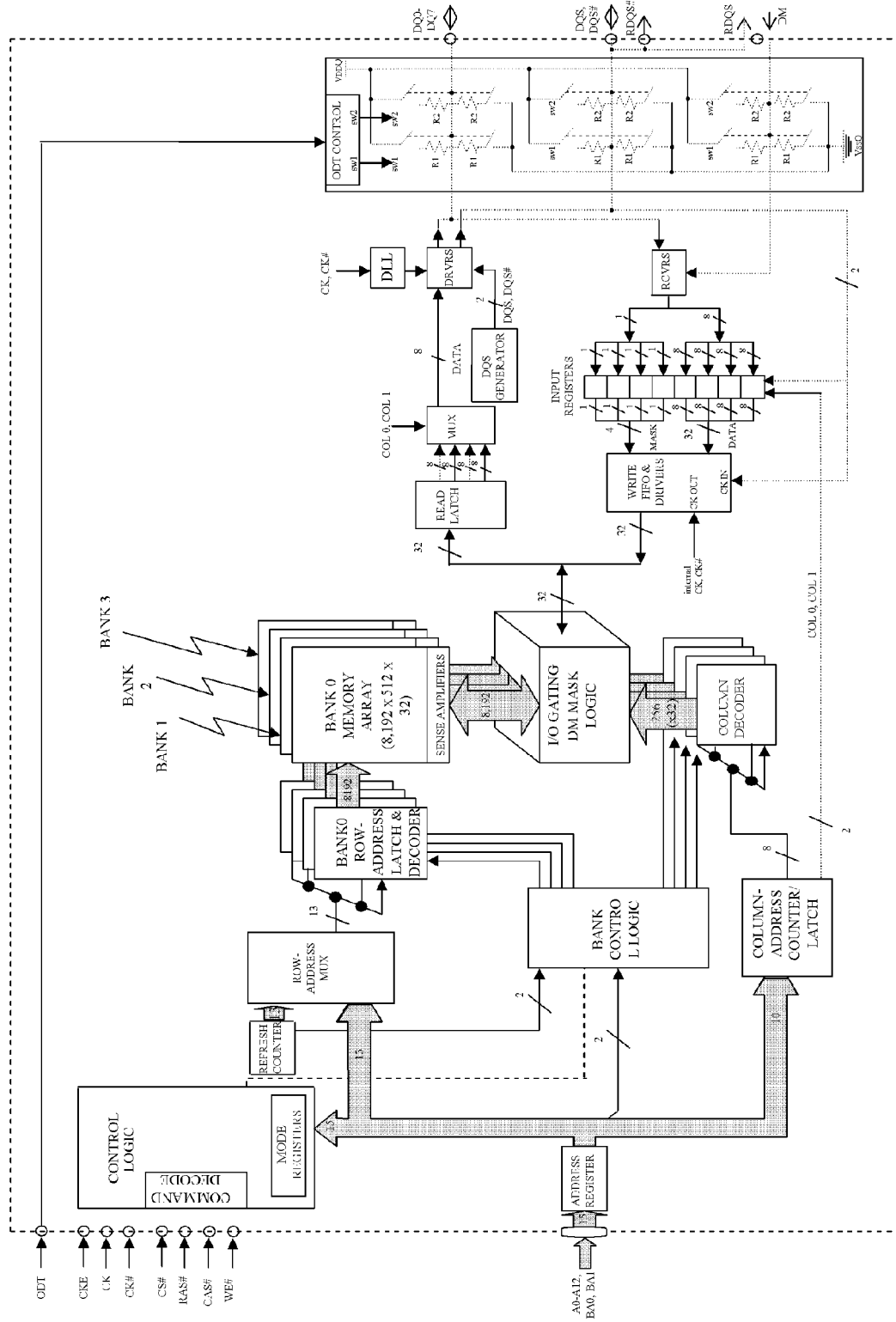
FIG. 2 illustrates a block diagram of a commercially-available 32 Meg×8, DDR2 SDRAM.
Figure 3:
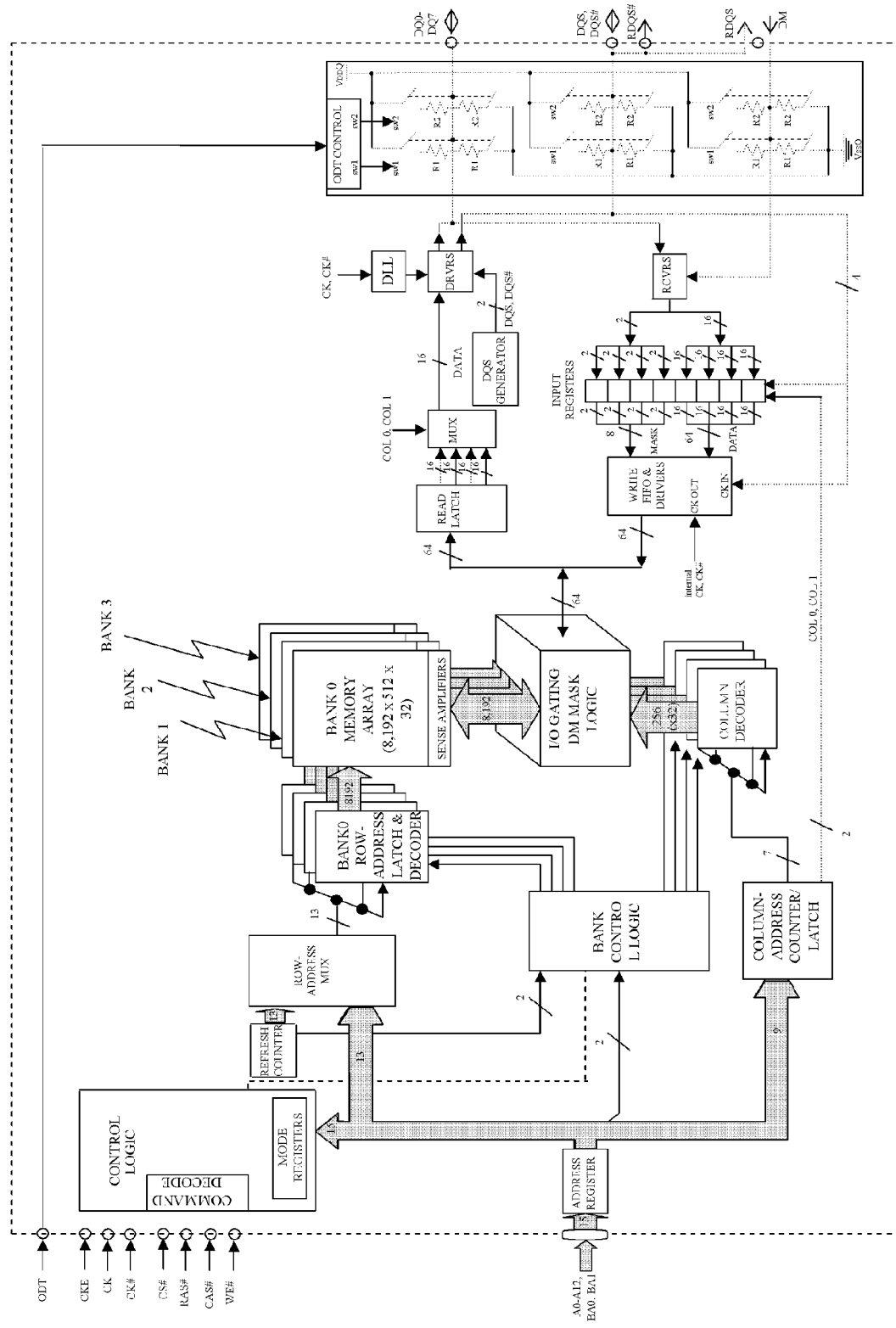
FIG. 3 illustrates a block diagram of a commercially-available 16 Meg×16, DDR2 SDRAM.
Figure 4:
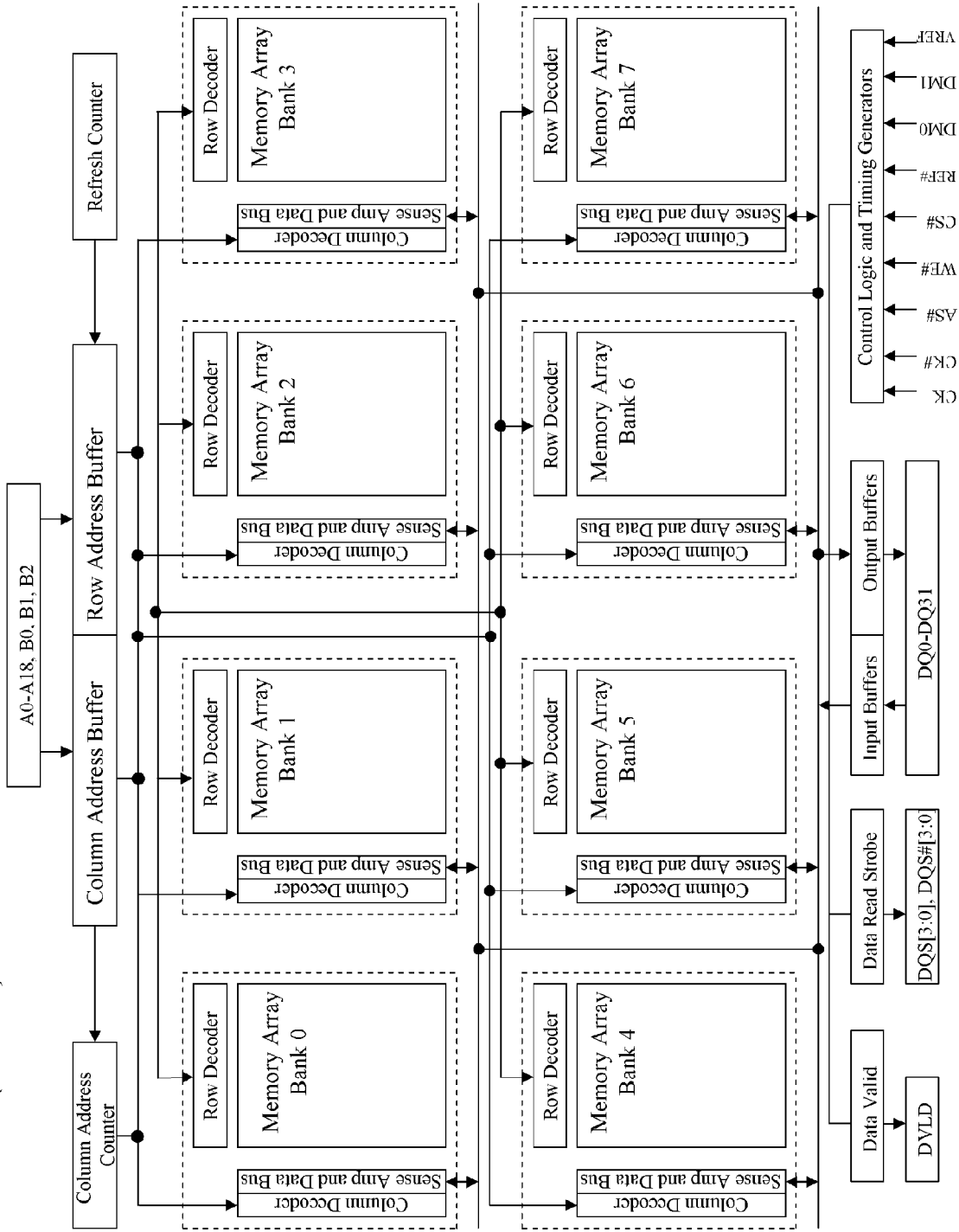
FIG. 4 illustrates a block diagram of a commercially-available 8 Meg×32, RL DRAM (reduced latency).
Figure 5:
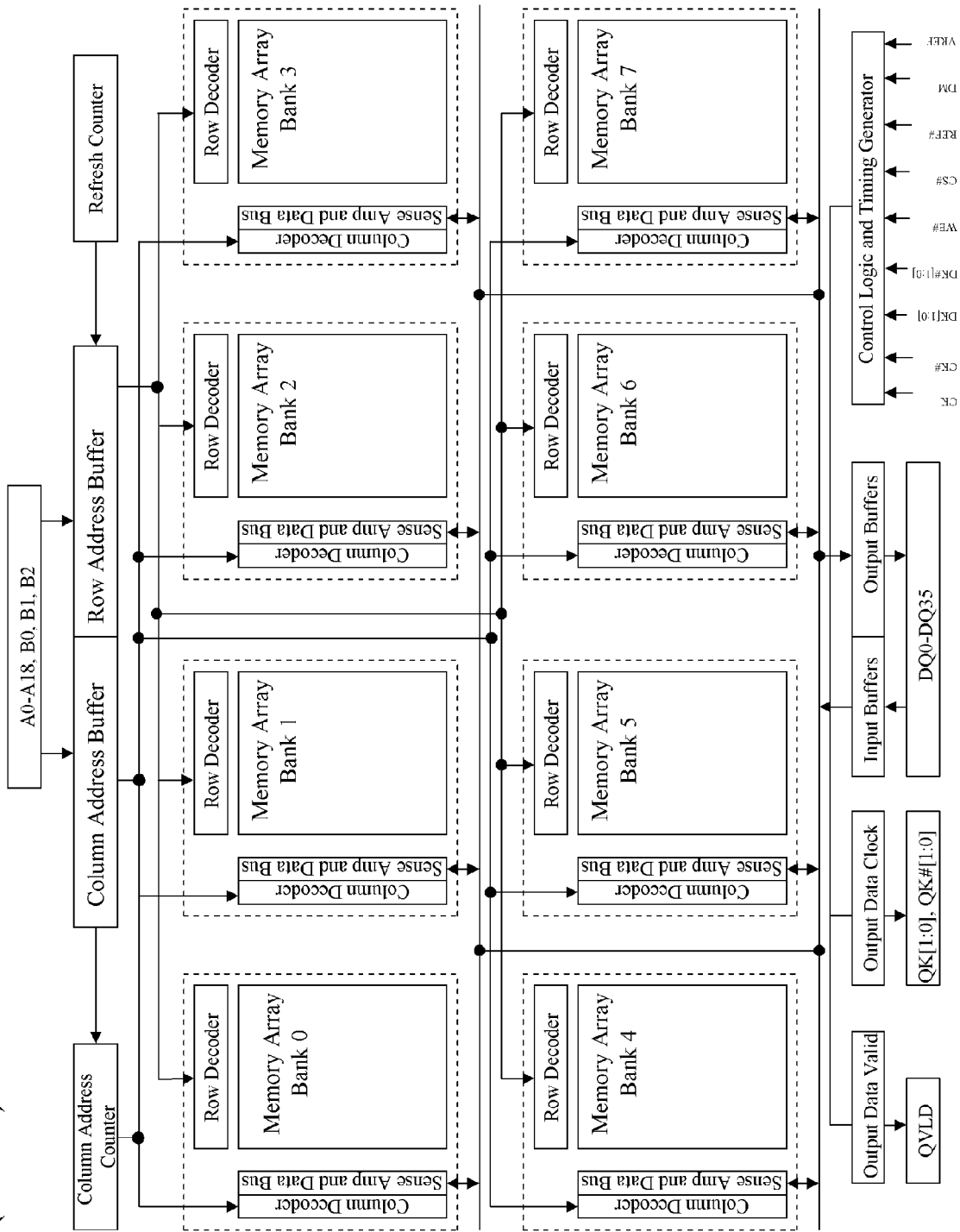
FIG. 5 illustrates a block diagram of a commercially-available 8 Meg×32, common I/O RL DRAM II.
Figure 6:
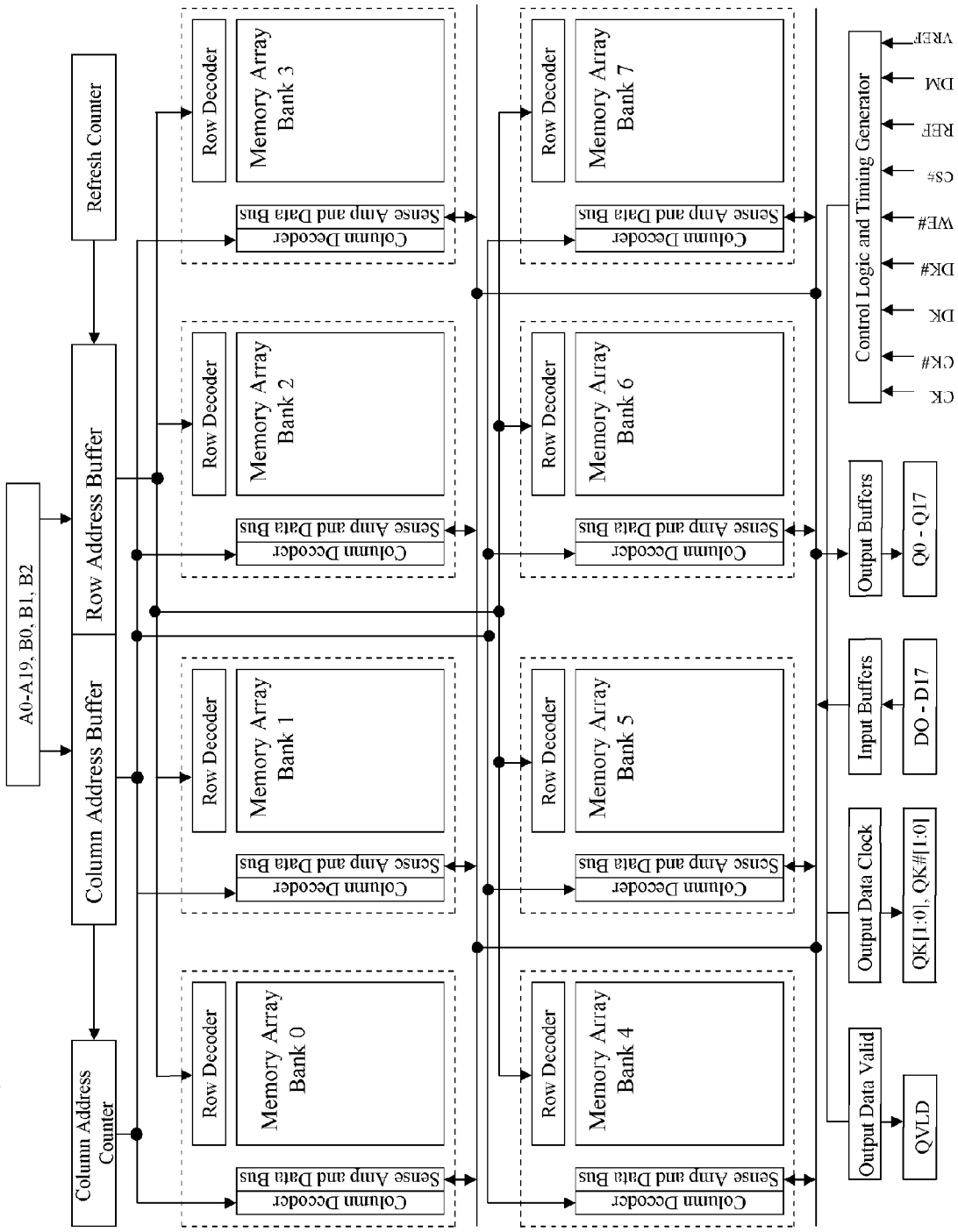
FIG. 6 illustrates a block diagram of a commercially-available 8 Meg×32, separate I/O RL DRAM II.
Figure 7:
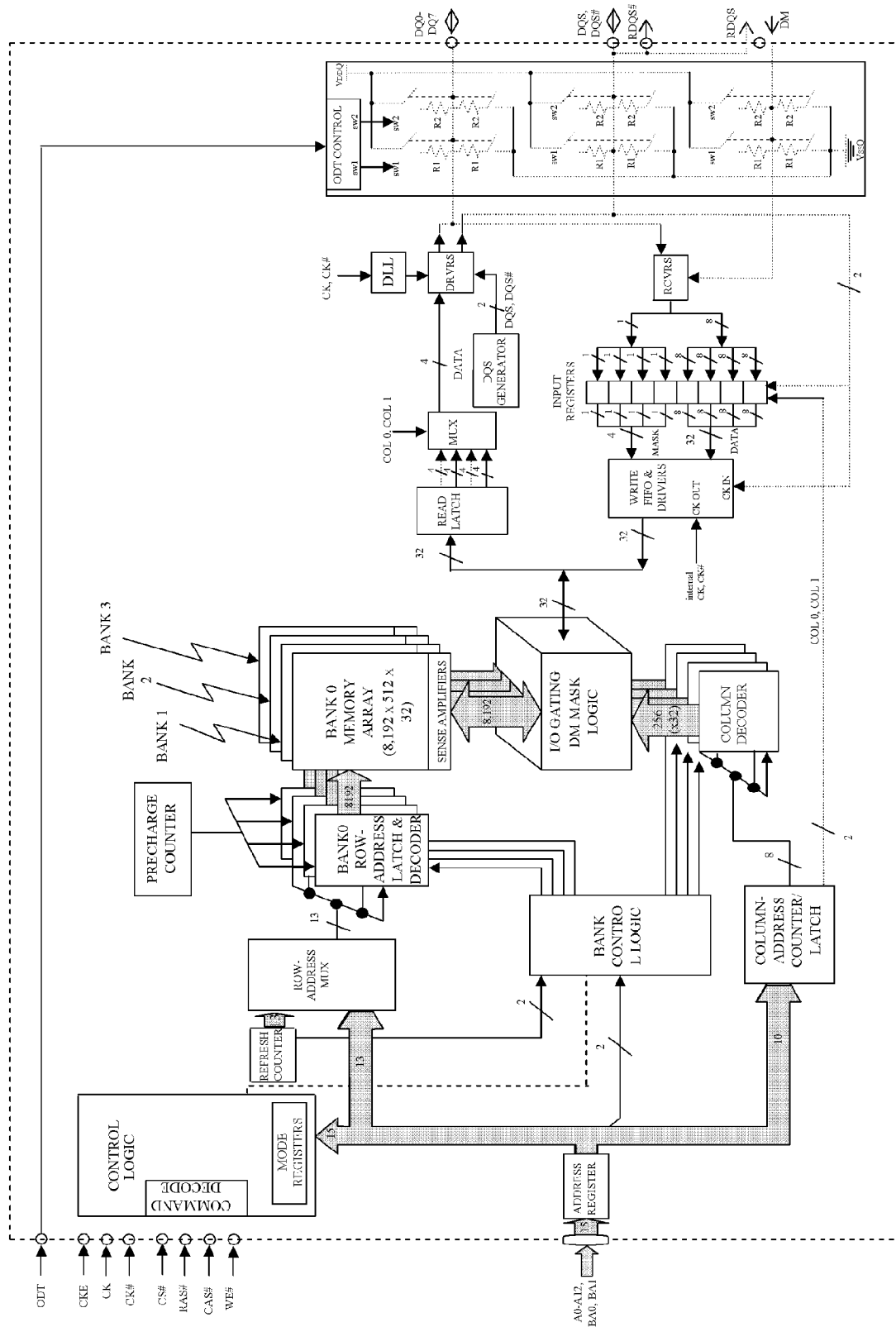
FIG. 7 illustrates a block diagram of the DRAM device of FIG. 1, modified in accordance with an embodiment of the present invention.

FIGS. 1 through 6 illustrate block diagrams of high level architectures for existing DRAM's commercially available from Micron Technology, Inc. These block diagrams are merely intended to be representative of known DRAM architectures, and not a limitation to the discussion and application of the present invention. FIG. 7 depicts one embodiment of the invention, represented as a modification of the architecture of FIG. 1. In FIG. 7, a precharge counter (operable to count (system) clock cycles) is shown as being incorporated in the row path of the memory architecture. The counter is similar in its operation to counters employed in VLSI design, though its function and utility are applied to provide a Posted Precharge for the DRAM memory device of FIG. 7. More specifically, while counters are used in DDR DRAM's to refresh data by row and prefetch "burst" bits in the column path, the precharge counter of the present invention is placed in the row path to perform a Posted Precharge operation as described below.

The precharge counter of this invention has two basic functions. First, when a row address is latched (as a result of a Bank Active Command) and a page is opened, the counter locks into that row address until reset. Second, when a Posted Precharge command is asserted, an internal activation for precharge after 'n' number of cycles is activated. The value of n can be programmed or fixed. Alternatively, n could be set in the Mode Register Set (MRS). Unlike current DRAM's that employ an Auto-Precharge command to automatically close a page, the Posted Precharge of this invention enables an open page (P1) to remain open (available) through the use of latches coupled to the sense amplifier associated with the bank on which the page is located, thereby permitting the storage of data read—from or written—to the sense amplifier. For example, a page can be kept open for 100 cycles or more. In this manner, the precharge counter of this invention enables the 'current page in a specific bank (P1) to be open' for a set time, while permitting the activation of another bank in the same IC and the opening of a different page in a different bank. In addition, by issuing an appropriate command, the current page OPEN time can be extended further (without violating other constraints, such as refresh), by interrupting a Posted Precharge activation (internally) if the memory system decides to extend the current open page.

In view of the above, until n number of cycles is completed on the precharge counter, if a need arises to go from a current page P2 to a previously opened page (P1), the previously opened page is available as a result of being held open by the precharge counter. After n cycles, if a new row is to be opened in the same bank, the bank goes into precharge after the page (P1) is closed. The present invention further offers the ability to reset the precharge counter if the same row is accessed in a consecutive bank activation cycle. In this manner, the 'n cycle open page' can be extended for as long as the memory system requires it. The precharge (internal) delay provided by the precharge counter—namely, from the time the precharge command is posted to the time the precharge for that particular bank is initiated—can be programably set to any number of desired clock cycles (to maximize bus efficiency).

Figure 8:
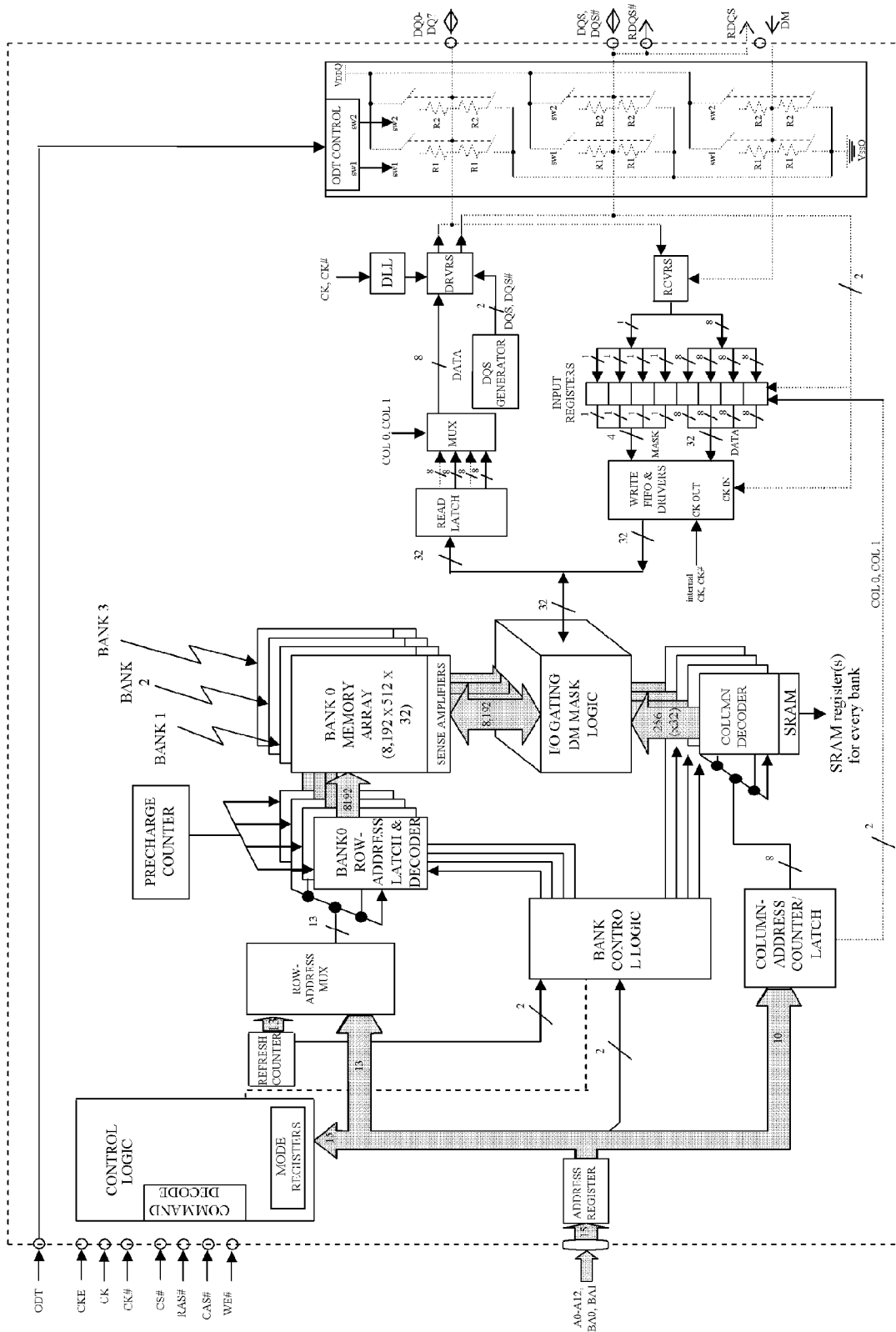
FIG. 8 illustrates a block diagram of the DRAM device of FIG. 2, modified in accordance with a second embodiment of the present invention.

FIG. 8 shows an embodiment of the invention similar to that of FIG. 7, except that an SRAM (static random access memory) is inserted next to the sense amplifiers. A benefit of this optional feature of the invention is the ability to achieve an ultra low CAS (column address strobe) latency. In computing systems where SDRAM's are used as system memory, there is an overwhelming imbalance between Reads and Writes (Reads far outweigh Writes), and thus one register dedicated only to Reads is preferred. In communication systems where SDRAM's are used for packet buffering, Reads and Writes are balanced; hence, separate SRAM registers for Reads and Writes are recommended. In communications memories where SDRAM's are used as Table Lookup Memory, Reads dominate Writes. Graphic memory, 3D mapping, texture memory, and search engine memories in general belong to the "unbalanced access" class. Although a CPU, NPU, or their associated chip set/cache memory (both on and off-chip) may contain an SRAM, placing the SRAM on the SDRAM chip itself (as represented in FIG. 8) provides unparalleled effectiveness in reducing power consumption and bus turnaround times by avoiding "off-DRAM" transactions.

Figure 9:
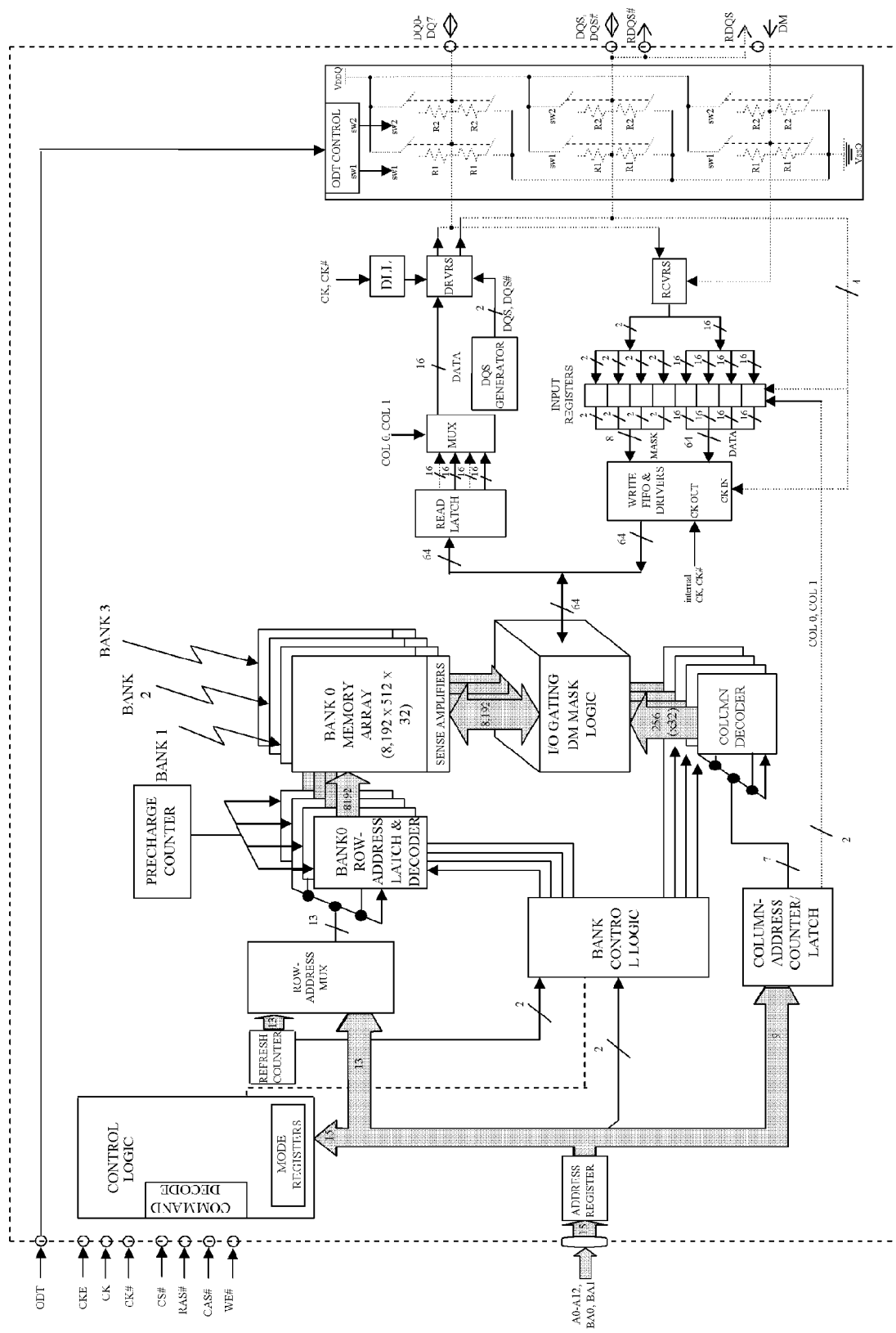
FIG. 9 illustrates a block diagram of the DRAM device of FIG. 3, modified in accordance with a third embodiment of the present invention.
Figure 10:
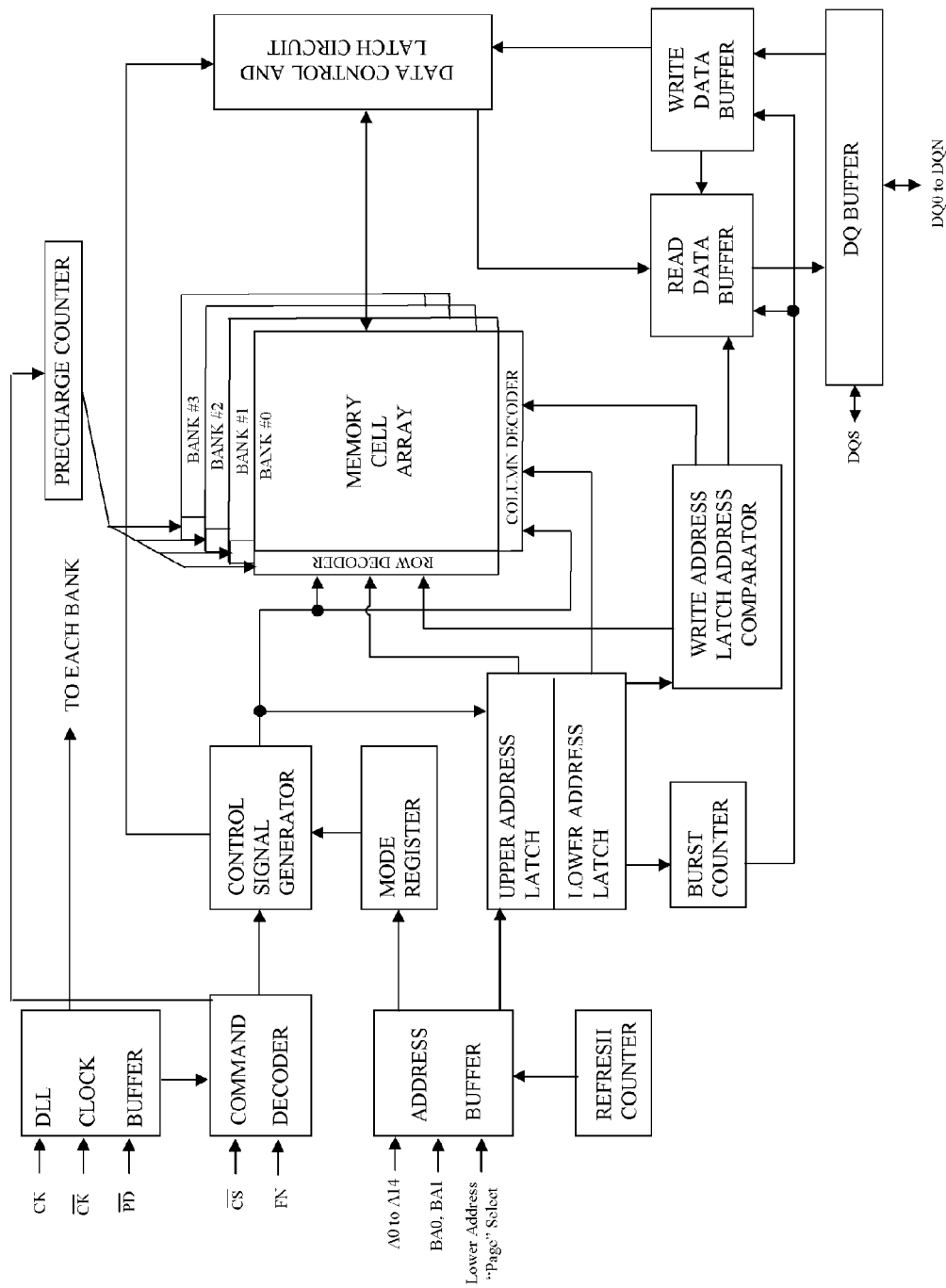
FIG. 10 illustrates a block diagram of a network DRAM modified in accordance with a fourth embodiment of the present invention.

Because the Posted Precharge function provided by the present invention allows more than one PAGE OPEN per DRAM IC, bus turnaround times are reduced. FIGS. 9 and 10 represent application of the invention to additional RAMJ devices, with FIG. 10 illustrating the application of the invention to a network centric DRAM. A specialty case of DRAM's is 1T SRAM's or Pseudo-SRAM's that use DRAM cores but a non-multiplexed SRAM interface. These specialty RAM's are used mostly in the general field of network memory where random accesses are the dominating type of access. Pseudo-SRAM's are limited foremost by the row cycle time or the RAS pulse width, and usually employ a Read—Auto-Precharge scheme to close the bank as early as possible (i.e., after the output of data to the I/O buffers) in order to speed up such devices by enabling subsequent accesses to different rows. With this operating scheme, a Precharge occurs in the background while a different row is in the process of being opened. However, a problem arises if a subsequent Read request falls into the same row, in which case the request will collide with the ongoing closing of the bank (Precharge) and cause the device to malfunction or crash. Advantageously, by delaying (posting) a Precharge with the precharge counter of this invention, any subsequent access of the same bank would find it open and would, therefore, be executed without additional row access latencies while concomitantly pushing out the Precharge further. If the subsequent access were to go to a different row, the Precharge of the first row would occur after the Additive Latency of the Posted Precharge. As such, with the flexible internally-timed Posted Precharge capability of this invention, it is possible to eliminate a notable problem encountered by Pseuo-DRAM's, because a subsequent access to the same page simply results in delaying of the Precharge.

In another embodiment of the invention, instead of an SRAM register, one can use an additional set of sense amplifiers in each bank. Preferably the sense amplifiers are identical, though this is not essential. The 'page select addresses' operate on one set of sense amplifiers, while the SDRAM memory bank operates on the other set. There is only one control for both sense amplifier blocks, so that any ambiguity is eliminated. It should be understood that the same concept can be applied to all other SDRAM's, including future SDRAM's comprising more than 4 or 8 banks and SDRAM's of architectures evolving beyond DDR-II.

Figure 11:
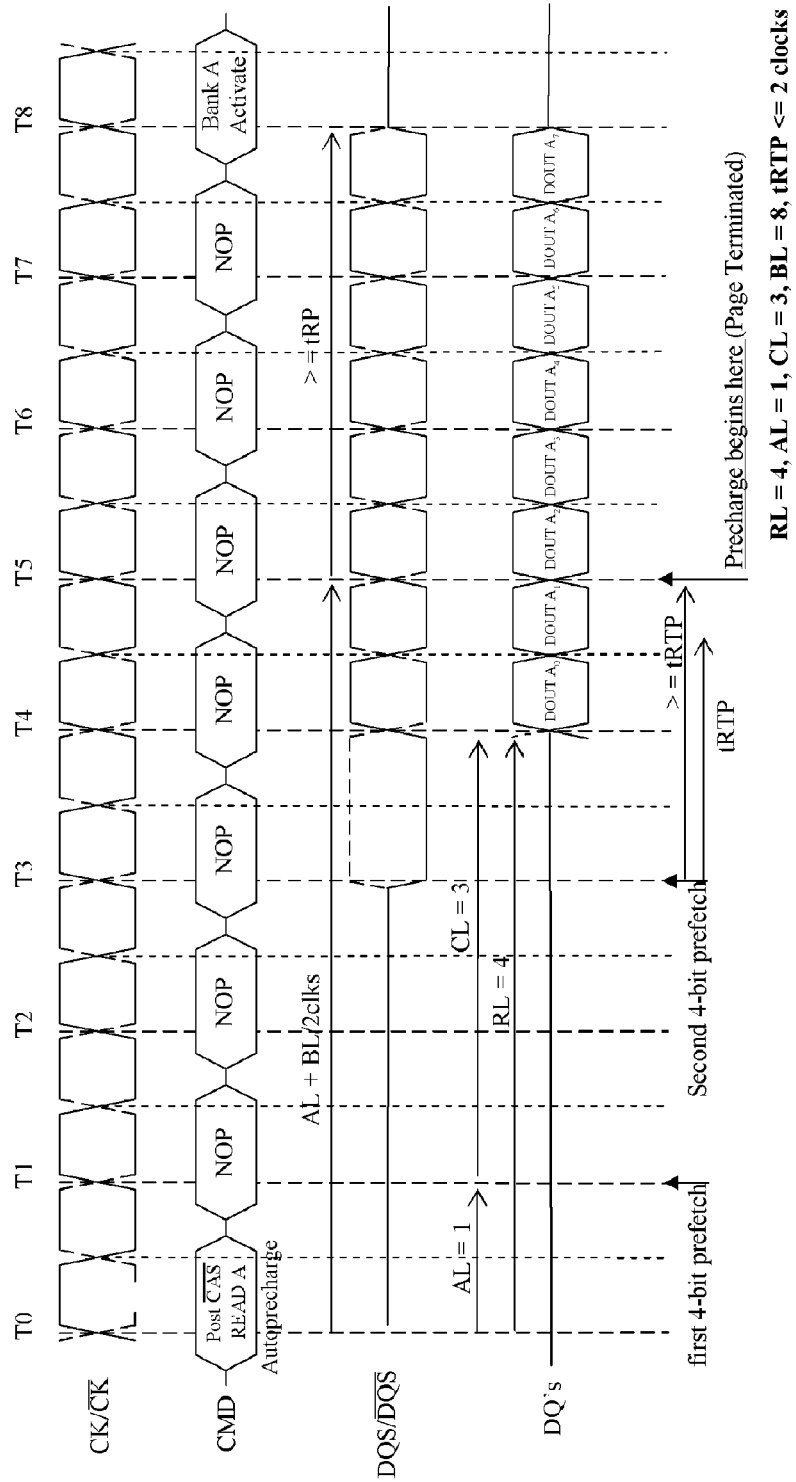
FIG. 11 illustrates an exemplary timing diagram for a standard DDR2 DRAM with burst read and auto-precharge in accordance with the prior art.
Figure 12:
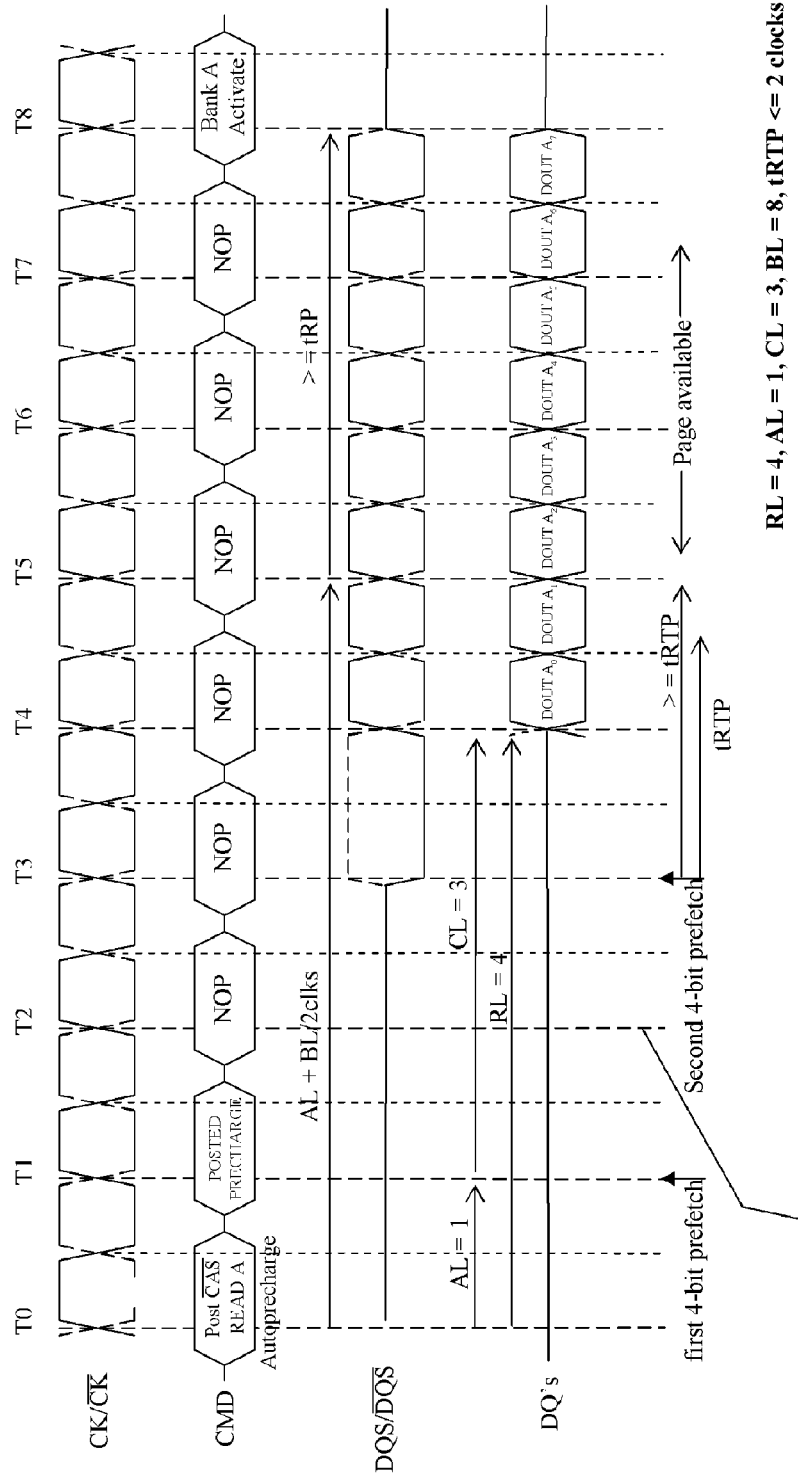
FIG. 12 illustrates a timing diagram for a standard DDR2 DRAM modified to have a Posted Precharge in accordance with the present invention.

FIGS. 11 and 12 compare the advantages of the present invention to current state-of-the-art DRAM devices, though it will be understood from the foregoing that the "multiple open pages" capability of this invention is easily extendable to flash and other memories. In addition to permitting multiple pages to be held open on different banks, another advantage of this invention is the ability to avoid idle bus cycles. With the memory controller under the supervision of the CPU/NPU (or its chip set), pages can be opened in the memory subsystem SDRAM IC's ahead of processor requirements. Pages can also be closed quickly, such as where a speculative instruction execution does not yield the desired result. A counter can also be used to keep track of when a page can be closed, so that a Posted Precharge can be Activated for continuous, peak bandwidth operation.

Another advantage of this invention is the ability to make a previously accessed page available even while a new bank/row address is presented (about 3 clock cycles). This operation improves effective bandwidth when data are written across page boundaries.

The invention as described above has the ability to solve most known performance issues of SDRAM's (standalone memory devices and memory modules). Each of the disclosed embodiments can be implemented on a memory controller controlling a memory module containing memory devices. It is also possible to design an ASIC to be mounted on such a memory module that contains the functions described above. There are numerous NC (no connect) pins available in commercial SDRAM's for implementing the invention. If it is a 4-bank SDRAM, 2 additional page-select pins can be used to switch among open pages within a SDRAM. An 8-bank SDRAM will require use of 3 pins. Reads/Writes, CAS and other commands require no changes.

While the invention has been particularly shown and described with reference to particular illustrative embodiments thereof, it will be understood by those skilled in the art that various changes in form and details are within the scope of the invention. Therefore, the scope of the invention is to be limited only by the following claims.

What is claimed is:

1. A semiconductor memory device comprising a bank with multiple pages, the device comprising means for keeping multiple pages open on the bank, wherein the keeping means comprises latches coupled to a sense amplifier associated with the bank, wherein the keeping means is operative to post a precharge command issued immediately after a command for a first access of one of the multiple pages in anticipation of a subsequent access of the page, the keeping means keeping the page open for a number of clock cycles and the precharge command causing a precharge operation to be executed after completion of the number of clock cycles, the latches operating in the storage of data read-from and written-to the sense amplifier.

2. The semiconductor memory device according to claim 1, further comprising means for resetting the keeping means if the subsequent access of the page occurs while the page is open, the resetting means operating to further delay execution of the precharge operation initiated by the precharge command.

3. The semiconductor memory device according to claim 1, wherein the bank comprises memory cells arranged in arrays of rows and columns, and the keeping means comprises a counter in a row path operatively connected to the rows of the bank.

4. The semiconductor memory device according to claim 1, wherein the device comprises a SRAM register coupled to the sense amplifier to provide low column access latency.

5. The semiconductor memory device according to claim 1, wherein bank comprises memory cells arranged in arrays of rows and columns, the memory cells comprise storage cells, and the storage cells comprise at least one transistor and at least one capacitor.

6. The semiconductor memory device according to claim 1, wherein the device has a dynamic random access memory architecture.

7. A semiconductor memory device comprising a bank with multiple pages, the device comprising means for keeping multiple pages open on the bank, wherein the keeping means is operative to post a precharge command issued immediately after a command for a first access of one of the multiple pages in anticipation of a subsequent access of the page, the keeping means comprising latches coupled to a sense amplifier associated with the bank, the latches operating in the storage of data read-from and written-to the sense amplifier, wherein the device is a nonvolatile memory device with multiple pages open in a block or sector thereof.

8. The semiconductor memory device according to claim 7, wherein the device is a flash memory device.

9. A semiconductor memory controller operable to issue commands to a memory module comprising multiple memory integrated circuits with memory cells arranged in arrays of rows and columns defining multiple pages, the memory controller comprising means for performing a posted precharge operation immediately after a command for a first access of a page in anticipation of a subsequent access of the page, the performing means comprising latches coupled to sense amplifiers associated with the memory integrated circuits, the latches operating in the storage of data read-from and written-to the sense amplifiers.

10. The semiconductor memory controller according to claim 9, wherein the performing means comprises a counter in a row path operatively connected to the rows of the memory cells.

11. The semiconductor memory controller according to claim 10, further comprising means for resetting the counter if the subsequent access of the page occurs while the page is open, the resetting means operating to further delay execution of the precharge operation.

12. The semiconductor memory controller according to claim 9, further comprising means for resetting the performing means if the subsequent access of the page occurs while the page is open, the resetting means operating to further delay execution of the precharge operation.

13. The semiconductor memory controller according to claim 9, wherein the memory controller comprises a SRAM register coupled to the sense amplifiers to provide low column access latency.

14. The semiconductor memory controller according to claim 9, wherein the memory cells comprise storage cells, and each of the storage cells comprises at least one transistor and at least one capacitor.

15. The semiconductor memory controller according to claim 9, wherein the memory controller is a component of a dynamic random access memory architecture.

16. The semiconductor memory controller according to claim 9, wherein the memory controller is a component of a nonvolatile memory device with multiple pages open in a block or sector thereof.

17. The semiconductor memory controller according to claim 16, wherein the memory controller is a flash memory device.

18. A semiconductor memory controller operable to issue commands to a memory module comprising multiple memory integrated circuits with memory cells arranged in arrays of rows and columns defining multiple pages, the memory controller comprising means for performing a posted precharge operation immediately after a command for a first access of a page in anticipation of a subsequent access of the page, wherein the memory controller further comprises sense amplifiers and a SRAM register coupled to the sense amplifiers to provide low column access latency.

19. The semiconductor memory controller according to claim 18, wherein the performing means comprises latches coupled to the sense amplifiers and operating in the storage of data read-from and written-to the sense amplifiers.

20. A method comprising keeping open more than one page of multiple pages on a bank of a semiconductor memory device and posting a precharge command issued immediately after a command for a first access of one of the multiple pages in anticipation of a subsequent access of the page, wherein the keeping step is performed with latches coupled to a sense amplifier associated with the bank, the latches operating in the storage of data read-from and written-to the sense amplifier.

21. The method according to claim 20, wherein the page is kept open for a number of clock cycles following the precharge command and the precharge command causes a precharge operation to be executed after completion of the number of clock cycles.

22. The method according to claim 21, further comprising the step of resetting the number of clock cycles if the subsequent access of the page occurs while the page is open, the resetting step operating to further delay execution of the precharge operation.

23. The method according to claim 20, wherein a precharge operation is initiated after the precharge command and following a delay determined by a counter.

24. The method according to claim 23, further comprising the step of resetting the counter so as to further delay the precharge operation if the subsequent access of the page occurs while the page is open.

25. The method according to claim 20, further comprising the step of providing low column access latency with the sense amplifier and a SRAM register coupled to the sense amplifier.

26. A method comprising keeping open more than one page of multiple pages on a bank of a semiconductor memory device, wherein the keeping step is performed with latches coupled to a sense amplifier associated with the bank, the latches operating in the storage of data read-from and written-to the sense amplifier, the bank comprises memory cells arranged in arrays of rows and columns, and a precharge command is performed by a precharge counter that, when a row address is latched and a page is opened, the counter locks into the row address until reset, and when the precharge command is made, an internal activation for performing a precharge operation is activated after a predetermined number of clock cycles.

* * * * *